United States Patent [19]

Kirby

[11] Patent Number: 5,562,814
[45] Date of Patent: Oct. 8, 1996

[54] SLUDGE-LIMITING TIN AND/OR LEAD ELECTROPLATING BATH

[75] Inventor: John Kirby, Norfolk, Nebr.

[73] Assignee: Dale Electronics, Inc., Columbus, Nebr.

[21] Appl. No.: 522,518

[22] Filed: Sep. 1, 1995

[51] Int. Cl.$^6$ .............. C25D 3/56; C25D 3/60; C25D 3/30

[52] U.S. Cl. ............ 205/238; 205/252; 205/255; 205/299; 205/300

[58] Field of Search ............ 205/238, 252, 205/255, 299, 300, 257; 106/1.24, 1.25, 1.28

[56] References Cited

U.S. PATENT DOCUMENTS

| | | | |
|---|---|---|---|
| 4,459,185 | 7/1984 | Obata et al. | 204/43 |
| 4,565,609 | 1/1986 | Nobel et al. | 204/44.4 |
| 4,582,576 | 4/1986 | Opaskar et al. | 204/44.4 |
| 4,599,149 | 7/1986 | Nobel et al. | 204/44.4 |
| 4,617,097 | 10/1986 | Nobel et al. | 204/44.4 |
| 5,066,367 | 11/1991 | Nobel et al. | 204/44.4 |
| 5,364,459 | 11/1994 | Senda et al. | 106/1.28 |

*Primary Examiner*—Kathryn Gorgos
*Assistant Examiner*—Edna Wong
*Attorney, Agent, or Firm*—Zarley, McKee, Thomte, Voorhees, & Sease

[57] ABSTRACT

A novel electroplating bath is described which comprises an alkane or alkanol sulfonic acid, tin, lead or tin-lead metal alloy and either an alkali carbonate or alkali bicarbonate salt. The addition of the alkali carbonate or bicarbonate salts reduces tin oxidation and thus decreases the amount of sludge formation in the bath.

20 Claims, No Drawings

SLUDGE-LIMITING TIN AND/OR LEAD ELECTROPLATING BATH

FIELD OF THE INVENTION

The present invention relates to tin and/or lead electroplating baths and methods of electroplating tin and/or lead alloys onto composite substrates.

BACKGROUND OF THE INVENTION

Tin, lead and tin-lead alloy deposits have been used for many years in the electronics industry. These deposits are used, in particular, in the manufacture of printed circuit boards, electrical contacts and connectors, semiconductors, electrical conduit, and other related parts. These alloy deposits are used to improve solderability and to form etching resistant films on electrical and electronic parts. Plating of electronics is achieved through the use of electroplating solutions containing tin, lead, or tin-lead alloys. These baths are widely employed to permit high speed uniform metal plating of tin, lead or tin-lead alloy.

Traditional electroplating baths have utilized fluoborates in solution with the two metals with an excess of fluoboric and boric acid. The fluoborate-based baths have been successful in obtaining electrical and electronic components with smooth matte deposits. However, these baths are problematic since the fluoborate baths are extremely corrosive to equipment and highly toxic. Further, fluoborates are difficult to remove from the waste water that follows the plating operation.

More recent developments in electroplating baths use alkane or alkanolsulfonic acids containing one to five carbon atoms which are capable of forming soluble complex salts with divalent tin and lead. See for example U.S. Pat. No. 4,459,185, herein incorporated by reference. The alkane or alkanolsulfonic acids provide tin, lead and tin-lead alloy plating baths capable of giving uniform and dense deposits on substrate surfaces at high speed, without employing the fluoborates that can cause environmental pollution problems. U.S. Pat. No. 4,459,185, herein incorporated by reference, further describes the addition of one or more specified cationic, amphoteric and/or nonionic surfactants and one or more leveling agents to an alkane- or alkanolsulfonic acid plating bath and a divalent tin salt, divalent lead salt, or a tin/lead mixture.

Modern tin and/or lead alloy plating baths require tin and lead to exist in the divalent state. Problems commonly associated with tin and tin-lead alloy plating baths include factors present during the electroplating process which can cause the oxidation of tin from the divalent state to the tetravalent state. In the high speed electroplating process, for example, the rapid pumping action and solution movement common to high speed plating machines causes air to be mixed with the solution, thereby promoting such oxidation. This oxidation is accelerated due to the elevated temperature of operation which is commonly used in high speed plating installations.

When divalent tin becomes tetravalent, it tends to precipitate in the bath as stannic oxide, thereby forming a sludge with a corresponding loss of available metal for electrodeposition. This sludge reduces the efficiency of the bath and causes operating problems because of its tendency to clog the jets and sprayers of the agitation system. This in turn results in frequent and costly production shut downs for clean up and removal. It is therefore very important to use plating baths which will substantially limit the formation of tetravalent tin under the particular electroplating conditions used.

The prior art discloses a method of reducing tetravalent tin and stannic oxide sludge formation in high speed tin or tin-lead electroplating solutions using an antioxidant, such as pyrocatechol, resorcinol, and hydroquinone, and a soluble alkyl or alkylol sulfonic acid in an amount sufficient to provide a pH of less than 3 to the solution (see U.S. Pat. No. 5,066,367, herein incorporated by reference). However, use of these well-known antioxidants have still resulted in the formation of large quantities of sludge during the electroplating process.

According to U.S. Pat. No. 4,681,670, the pH of methane sulfonic acid baths may be raised to a preferred range of between 3 and 4 using alkali hydroxides, such as sodium and potassium hydroxide. Raising pH by sodium hydroxide, however, is problematic for a number of reasons. First, the reaction of sodium hydroxide with the alkane- or alkyl sulfonic acid bath at increased pH oxidizes the tin and/or lead which results in the metal precipitating out of solution to form a sludge. Secondly, the reaction between alkane- and alkyl sulfonic acid baths and alkali hydroxides proceed very quickly and generate large amounts of heat. The speed of these reactions also adds to the formation of metal precipitate within the electroplating bath. Also, the alkali hydroxides are highly toxic if inhaled and are strong tissue (eye, skin, mucous membrane) irritants. Thus, they are extremely difficult to work with.

There is thus a need in the art for an alkyl and alkylol sulfonic acid plating bath which prevents the formation of sludge due to oxidation within the solution and which is safe to work with.

It is therefore a primary object of the present invention to provide a tin and/or lead electroplating solution which reduces the amount of oxidation in the solution during processing, thus limiting the amount of sludge formation.

It is another object of the present invention to provide a tin and/or lead electroplating solution which utilizes slower reaction times and generates less heat than prior art reaction solutions.

It is yet another object of the present invention to provide a tin and/or lead electroplating solution which is safe to use and economical to make.

The method of accomplishing these and other objects will become apparent from the following description of the invention.

SUMMARY OF THE INVENTION

This invention relates to novel tin, lead or tin-lead electroplating solutions which contain alkali carbonate and/or bicarbonate salts and methods of their preparation. The addition of these mild alkali carbonate salts are used to increase the pH of methane sulfonic or dimethyl sulfonic (alkane or alkyl sulfonic) acid baths for tin, lead or tin-lead alloy electroplating baths up to a pH of 5.0.

The alkali carbonate and bicarbonate salt solutions result in slower reactions than those occurring in conventional electroplating solutions and, thus, the generation of less heat. This in turn prevents the precipitation of stannic oxide and decreased sludge formation. Further, during the reaction of the alkali carbonate or bicarbonate salt with the methane sulfonic acid electroplating bath, carbon dioxide is released which forms a protective layer over the electroplating solution which further prevents tin oxidation.

Moreover, the alkali carbonate and bicarbonate salts disclosed in the present invention are nontoxic and safe to work with.

DETAILED DESCRIPTION OF THE PREFERRED EMBODIMENT

The present invention discloses an electroplating solution for tin, lead, and tin-lead alloy electroplating baths which contain carbonate or bicarbonate salts in a concentration sufficient to raise the pH of the solution up to 5. The electroplating solution of the present invention comprises an alkane or alkanol sulfonic acid solution and its tin and/or lead salt. Examples of such alkanesulfonic acids are methane-, ethane-, propane-, 2-propane-, butane-, 2-butane-, pentane-, hexane-, decane-, and dodecanesulfonic acids. These alkanesulfonic acids may be used singly or in a mixture of two or more.

Examples of useful alkanolsulfonic acids include isethionic acid (2-hydroxyethane-1-sulfonic acid), 2-hydroxypropane-1-, 1-hydroxypropane-2-, 3-hydroxypropane-1-, 2-hydroxybutane-1-, 4-hydroxybutane-1-, 2-hydroxypentane-1-, 2-hydroxyhexane-1-, 2-hydroxydecane-1-, and 2-hydroxydodecane-1-sulfonic acids. These hydroxy-containing alkanesulfonic acids may also be used singly or as a mixture of two or more.

In the case of tin plating, the bath contains an alkane-or alkanolsulfonic acid as described above and a divalent tin salt thereof. Likewise, a lead plating bath contains a sulfonic acid and a divalent lead salt thereof, and a tin-alloy plating bath contains such a sulfonic acid and divalent tin and lead salts thereof. The total concentration in terms of metal of the tin salt and/or lead salt in the plating bath is desirably in the range from 0.5 to 200 g., preferably from 10–100 g. per liter of the bath. The concentration of the alkane or alkanolsulfonic acid to be present in the plating bath is at least stoichiometrically equivalent to the divalent tin and/or lead ions in the bath. The concentration of the alkane or alkanolsulfonic acid is in general in the range from 10–500 g., preferably from 50–200 g. per liter of the bath.

Due to their similar chemical properties and chemical reactivities, any alkali carbonate or bicarbonate or combination thereof is acceptable for use in the present invention. Examples of carbonates include lithium carbonate, sodium carbonate, potassium carbonate, rubidium carbonate, cesium carbonate, and lead carbonate. Examples of acceptable bicarbonates include lithium hydrogen carbonate, sodium hydrogen carbonate, potassium hydrogen carbonate, rubidium hydrogen carbonate, and cesium hydrogen carbonate. Because of their lower pH, the alkali bicarbonate salts are preferred and sodium bicarbonate is most preferred. The amounts and concentrations of the alkali carbonate and bicarbonate salts should be sufficient to raise the pH of the electroplating solution to about 5 or less.

The pH of the alkali carbonate salt solution should be between about 11.0 and 12.0 and the pH of the alkali hydrogen carbonate salt solution should be between about 9.5 and 11.0. These solutions are less basic than typical alkali hydroxide solutions which have a pH in the range of between 13–14. The alkali hydroxides require workers to take precautionary measures since their use is associated with respiratory, skin, and mucous membrane toxicity. Thus, because of their lower pH, the alkali carbonate and bicarbonate solutions are less caustic and much safer to use.

Further, due to the lower pH of the described carbonate and bicarbonate solutions, the reactions which occur within the methane sulfonic acid baths proceed more slowly than the reactions which occur with the alkali hydroxides. Because of these slower reactions, less heat is generated within the electroplating solutions which prevents the oxidation of tin and lead which also aids in the prevention of the formation of metal precipitates.

As previously stated, the pH of the electroplating bath of the present invention following the addition of alkali carbonate or bicarbonate can be from about 5 or less in order to prevent the precipitation of metal oxide. The pH is preferably in the range of about 2.5–3.5.

It must be appreciated that the improved electroplating bath of the present invention may include other substances which are typically added to the bath which are well known to those of ordinary skill in the art. Such substances include brighteners, surfactants, and leveling agents.

The following are examples of the reactions that occur between the methane sulfonic tin baths and bicarbonates in accordance with the present invention:

1. $CH_3SO_3H + NaHCO_3 \rightarrow CH_3SO_3Na + H_2CO_3$
2. $H_2CO_3 \rightarrow H_2O + CO_2\uparrow$
3. $(CH_3SO_3)_2Sn + 2NaHCO_3 \rightarrow 2\ CH_3SO_3Na + Sn(HCO_3)_2$
4. $Sn(HCO_3)_2 + 2CH_3SO_3H \rightarrow (CH_3SO_3)_2Sn + 2H_2CO_3$
5. $2H_2CO_3 \rightarrow 2CO_2\uparrow + 2H_2O$ Similar reactions occur with the use of carbonates:

$$PbCO_3 + 2CH_3SO_3H \rightarrow (CH_3SO_3)2Pb + H_2O + CO_2\uparrow$$

The above reactions are substantively similar with respect to other alkali carbonate and bicarbonate salts. Essentially, the alkali portion of the alkali carbonate or bicarbonate molecule binds with the alkyl- or alkanesulfonate portion of the alkane- or alkyl sulfonic acid and either a molecule of hydrogen or dihydrogen carbonate is formed. This hydrogen carbonate molecule ionizes to form water and carbon dioxide gas, which hovers over the remaining reaction mixture. Then, either stannous or plumbous carbonate or bicarbonate is formed which next reacts with the alkyl sulfate to form stannous (or plumbous) methyl sulfate. This compound remains dissolved in the reaction mixture and does not precipitate so long as the reaction pH is kept at 5 or below.

In contrast to the present invention, the addition of an alkali hydroxide to the methane sulfonic acid baths for tin and/or lead alloys creates less desirable reactions in the mixture:

1. $CH_3SO_3H + NaOH \rightarrow CH_3SO_3Na + H_2O$
2. $(CH_3SO_3)_2Sn + 2NaOH \rightarrow 2CH_3SO_3Na + Sn(OH)_2\downarrow$
3. $Sn(OH)_2 + 2CH_3SO_3H \rightarrow (CH_3SO_3)_2\ Sn + 2H_2O$
4. $2Sn(OH)_2 + O_2 + 2H_2O \rightarrow 2Sn(OH)_4\downarrow$ As demonstrated above, if the pH of the bath is over 1.5, the addition of sodium hydroxide results in the formation of stannous hydroxide, which is insoluble in the bath and thus precipitates out of solution, as in Reaction No. 2. If the pH of the bath is below 1.5, Reaction No. 3 occurs which also results in the stannous hydroxide dissolving.

Even at the lower pH, however, strong agitation is required during the reaction process. This causes air to be mixed with the solution, thereby promoting tin oxidation from stannous to stannic hydroxide (Reaction No. 4). The stannic hydroxide formed does not dissolve in the bath and precipitates. This oxidation is accelerated due to the elevated temperatures used during the chemical reactions. It can thus be appreciated that the addition of the alkali carbonate and bicarbonate salts of the present invention to methane sulfonic acid baths is highly desirable in comparison to the alkali hydroxides.

Moreover, carbonate and bicarbonate salts are inherently safer to use than alkali hydroxides which, since they typically have a pH of from 13–14, are highly corrosive and difficult to work with. In addition, the reaction mixture itself can be kept at a higher pH of up to 5 which, overall, is safer for workers and less corrosive on the high-speed plating machinery used than reaction mixtures which are ideally kept at 3 or below in conventional tin, lead, and tin-lead alloy baths.

The alkali carbonate or bicarbonate salts used in the present invention may be used as powders, crystals or aqueous solutions which may be saturated or diluted. The only requirement is that the pH be within their designated ranges of between about 11.0 and 12.0 for alkali carbonate salt solutions and about 9.5 and 11.0 for alkali hydrogen carbonates. These salts are added slowly to the tin lead and tin/lead alloy plating baths with agitation.

The following examples are offered to further illustrate the product and process of this invention. They are not intended to limit the scope of the invention in any manner.

EXAMPLE 1

Preparation of Tin/Lead Bath 100 g of methane sulfonic acid is added to 500 ml deionized water. 40 g of sodium hydrogen carbonate powder is then slowly added. Cool solution to room temperature (pH should be less than 1.0).

Add desired surfactant and leveling agent then add 16 g tin metal as stannous methane sulfonate, and 8 g lead as lead methane sulfonate (bath will have pH less than 1.0). Adjust the pH to between 2.5–3.5 or to desired pH level using sodium hydrogen carbonate as powder and q.s. to 1000 ml with deionized water. Slow agitation is required during the entire operation. The resulting bath is 60% tin and 40% lead.

EXAMPLE 2

A study was conducted comparing the effect of rising pH of tin and lead solutions containing sodium hydroxide alkali salt in comparison to the claimed alkali carbonate and bicarbonate salts of the present invention, each in solutions containing 7–16 g/l of tin and 1–8 g/l of lead. The results are as set forth in the table below:

| NaOH | | $Li_2CO_3$ | | $CsHCO_3$ | | $NaHCO_3$ | |
|---|---|---|---|---|---|---|---|
| g/l | pH | g/l | pH | g/l | pH | g/l | pH |
| 0 | 1.50 | 0 | 1.55 | 0 | 2.0 | 0 | 1.53 |
| 1.6 | 1.74 | 2.0 | 1.95 | 6.4 | 2.30 | 3.62 | 1.70 |
| 3.2 | 2.00 | 4.0 | 2.35 | 10.0 | 2.56 | 7.24 | 1.81 |
| 4.0 | 2.12 | 6.0 | 2.82 | 16.0 | 2.86 | 10.86 | 2.32 |
| 4.8 | 2.30 | 8.0 | 3.44 | 18.0 | 3.15 | 14.48 | 2.70 |
| 6.4 | 2.66 | 10.0 | 4.10 | 26.0 | 3.43 | 18.10 | 3.16 |
| 8.0 | 3.10 | 12.0 | 4.95 | 36.0 | 3.90 | 21.72 | 3.66 |
| 9.6 | 3.57 | | | 46.0 | 4.79 | 25.34 | 4.09 |
| 11.2 | 4.09 | | | 56.0 | 5.50 | 28.96 | 4.70 |
| 12.8 | 4.75 | | | | | 32.58 | 5.30 |
| 13.6 | 5.10 | | | | | 36.20 | 5.70 |
| 14.4 | 5.40* | | | | | | |

*metals precipitation

As the above results demonstrate, in the carbonate and bicarbonate solutions the tin and lead remained more stable as the pH of the solution was increased. At pH 5.4, the metals precipitated out of solution with the sodium hydroxide. In contrast, the carbonate and bicarbonate-containing solutions of the present invention remained in solution even at pH levels of greater than 5.

As shown above, the use of alkali carbonate and bicarbonate salts eliminate metal precipitation up to pH 5.0 in alkyl or alkanol sulfonic acid baths. The carbon dioxide released during the reaction creates a protective layer which further prevents additional tin oxidation. Moreover, the slower reaction rates between the carbonate and bicarbonate salts with the alkane or alkanol sulfonic acid generates less heat than alkali hydroxide mixtures, thereby further decreasing the risk of tin oxidation. It can therefore be seen that the present invention accomplishes at least all of its stated objectives.

What is claimed is:

1. An electroplating solution comprising:
   a sulfonic acid;
   a metal selected from the group consisting of tin, lead, tin-lead alloys, tin alloys and lead alloys; and
   an alkali carbonate salt in an amount sufficient such that the pH of the electroplating solution is 5.0 or less.

2. The electroplating solution of claim 1 wherein the alkali carbonate salt is present in an amount sufficient to keep the alloy in solution.

3. The electroplating solution of claim 1 wherein the alkali carbonate salt is selected from the group consisting of lithium carbonate, sodium carbonate, lead carbonate, potassium carbonate, rubidium carbonate and cesium carbonate.

4. The electroplating solution of claim 1 wherein the alkali carbonate salt is an alkali bicarbonate salt.

5. The electroplating solution of claim 4 wherein the alkali bicarbonate salt is selected from the group consisting of lithium bicarbonate, sodium bicarbonate, potassium bicarbonate, rubidium bicarbonate and cesium bicarbonate.

6. The electroplating solution of claim 1 wherein the sulfonic acid is alkanesulfonic acid or alkanolsulfonic acid.

7. The electroplating solution of claim 1 wherein the pH of the solution is about 2.5 to about 3.5.

8. A method of making an electroplating bath for metal alloy electroplating comprising:
   preparing a solution comprising a sulfonic acid and a metal alloy;
   adding an alkali carbonate salt in an amount sufficient to prevent the oxidation of the metal alloy and such that the pH of the electroplating bath is 5.0 or less.

9. The method of claim 8 wherein the alkali carbonate salt is a bicarbonate salt.

10. The method of claim 8 or 9 wherein the alkali carbonate or bicarbonate salt is added by slow agitation.

11. The method of claim 9 wherein the bicarbonate salt is selected from the group consisting of lithium bicarbonate, sodium bicarbonate, potassium bicarbonate, rubidium bicarbonate and cesium bicarbonate.

12. The method of claim 9 wherein the sulfonic acid is an alkanesulfonic acid or an alkanolsulfonic acid.

13. The method of claim 8 wherein the alkali carbonate salt is in a form selected from the group consisting of a powder, crystal or aqueous solution.

14. The method of claim 8 wherein the alkali carbonate salt is selected from the group consisting of lithium carbonate, sodium carbonate, lead carbonate, potassium carbonate, rubidium carbonate and cesium carbonate.

15. An improved electroplating solution for electroplating comprising:
   a metal selected from the group consisting of tin, lead, tin-lead alloys, tin alloys and lead alloys;
   a sulfonic acid; and the improvement comprising an alkali carbonate or bicarbonate salt;

wherein the pH of the electroplating solution is 5.0 or less.

16. The electroplating solution of claim 15 wherein the alkali carbonate or bicarbonate salt comprises an alkali selected from the group consisting of lithium, sodium, lead, potassium, rubidium, and cesium.

17. The electroplating solution of claim 15 wherein the sulfonic acid is an alkanesulfonic acid or an alkanolsulfonic acid.

18. An electroplating solution comprising:
   a sulfonic acid;
   a metal selected from the group consisting of tin, lead, tin-lead alloys, tin alloys and lead alloys; and
   an alkali bicarbonate salt;
   wherein the pH of the electroplating solution is 5.0 or less.

19. An electroplating solution according to claim 18 wherein the pH of the solution is about 2.5 to about 3.5.

20. A method of making an electroplating bath for electroplating comprising:
   preparing a solution comprising a sulfonic acid and a metal or metal alloy;
   adding an alkali bicarbonate salt in an amount sufficient to prevent the oxidation of the metal or metal alloy and such that the pH of the solution is 5.0 or less.

* * * * *